United States Patent
Sumi et al.

(10) Patent No.: US 10,580,958 B2
(45) Date of Patent: Mar. 3, 2020

(54) PIEZOELECTRIC ELEMENT AND LIQUID EJECTION HEAD

(71) Applicant: Seiko Epson Corporation, Tokyo (JP)

(72) Inventors: Koji Sumi, Shiojiri (JP); Harunobu Koike, Chino (JP); Toshiaki Takahashi, Chino (JP); Koichi Morozumi, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/217,123

(22) Filed: Dec. 12, 2018

(65) Prior Publication Data

US 2019/0181328 A1    Jun. 13, 2019

(30) Foreign Application Priority Data

Dec. 13, 2017   (JP) ................ 2017-238792

(51) Int. Cl.
| | |
|---|---|
| *H01L 41/047* | (2006.01) |
| *B41J 2/14* | (2006.01) |
| *H01L 41/29* | (2013.01) |
| *H01L 41/318* | (2013.01) |
| *H01L 41/187* | (2006.01) |

(52) U.S. Cl.
CPC ...... *H01L 41/0477* (2013.01); *B41J 2/14233* (2013.01); *H01L 41/1873* (2013.01); *H01L 41/29* (2013.01); *H01L 41/318* (2013.01); *B41J 2002/14241* (2013.01); *B41J 2002/14419* (2013.01)

(58) Field of Classification Search
CPC . H01L 41/0477; H01L 41/29; H01L 41/1873; H01L 41/187; B41J 2/14233; B41J 2002/14419; B41J 2002/14241; B41J 2/14201
See application file for complete search history.

(56) References Cited

U.S. PATENT DOCUMENTS

| | | | |
|---|---|---|---|
| 9,842,984 B2 * | 12/2017 | Eguchi | ............ H01L 41/0477 |
| 2011/0187237 A1 | 8/2011 | Suenaga et al. | |
| 2015/0084486 A1 | 3/2015 | Eguchi | |

FOREIGN PATENT DOCUMENTS

| | | |
|---|---|---|
| JP | 2005-039179 A | 2/2005 |
| JP | 2005-244091 A | 9/2005 |
| JP | 2008-270514 A | 11/2008 |

OTHER PUBLICATIONS

Extended European Search Report for Patent Application No. EP18212093.1 dated Apr. 15, 2019 (6 pages).

* cited by examiner

*Primary Examiner* — Geoffrey S Mruk
(74) *Attorney, Agent, or Firm* — Harness, Dickey & Pierce, P.L.C.

(57) ABSTRACT

A piezoelectric element includes: a first electrode containing crystal grains; a piezoelectric layer which contains potassium, sodium, and niobium and which is provided above the first electrode; and a second electrode provided above the piezoelectric layer, and the average grain diameter of the crystal grains is less than 550 nm.

20 Claims, 7 Drawing Sheets

PIEZOELECTRIC ELEMENT AND LIQUID EJECTION HEAD

This application claims priority under 35 U.S.C. § 119 to Japanese Patent Application No. 2017-238792 filed on Dec. 13, 2017, the entire disclosure of which is expressly incorporated by reference herein.

BACKGROUND

1. Technical Field

The present invention relates to a piezoelectric element and a liquid ejection head.

2. Related Art

In general, a piezoelectric element includes a piezoelectric layer having electromechanical conversion characteristics and two electrodes sandwiching the piezoelectric layer. The piezoelectric element as described above is used, for example, for a liquid ejection head mounted in an ink jet recording head.

As a piezoelectric material used for the piezoelectric element, various materials, such as lead zirconate titanate (PZT), have been known. In recent years, in view of environmental protection, a lead-free piezoelectric material has been demanded, and for example, a niobium (Nb)-based material capable of forming a perovskite structure has been studied.

JP-A-2005-039179 has disclosed a ceramic electronic component in which as a piezoelectric ceramic layer, a Bi layer compound or a Nb-based perovskite compound is used, outside electrodes are formed on external surfaces of the piezoelectric ceramic layer using metal grains and a glass frit, and the average grain diameter of the metal grains in a surface layer is 3 μm or less.

When a piezoelectric body is formed, in order to increase the crystallinity thereof, in particular, an excess amount of an element to be disposed at the A site of the perovskite structure is charged in some cases before firing (crystallization) is performed. It has been known that by the process described above, the efficiency of crystallization is increased, and the crystallinity is improved. The characteristics as described above have been generally known when a piezoelectric body is crystallized by firing and are also believed to be obtained in the case in which a piezoelectric body is formed using a compound (hereinafter, referred to as "KNN" in some cases) containing potassium, sodium, and niobium.

However, it has been gradually understood that the crystallization mode of KNN is different from that of PZT. That is, when alkali metal elements (potassium and sodium) to be disposed at the A site are each charged in an excess amount, although the crystallinity is effectively improved, since being more liable to travel (diffuse) during crystallization, the alkali metal elements are not likely to be disposed at a predetermined position (A site); hence, a phenomenon that the alkali metal elements are swept out of the piezoelectric body may occur more apparently as compared to the case of PZT.

On the other hand, when an alkali metal element is incorporated in crystal grain boundaries of an electrode formed from a metal, the mechanical properties of the electrode may be changed in some cases. For example, when an alkali metal is incorporated in crystal grain boundaries of an electrode by diffusion during firing (crystallization) of a piezoelectric body, the natural frequency of a vibration plate including the electrode may be changed, and/or the uniformity of the natural frequency may be degraded in some cases. In addition, it has been understood that when a piezoelectric element is formed on a vibration plate, an alkali metal intrudes into a boundary portion between the vibration plate and an electrode layer of the piezoelectric element, and an adhesion strength between the vibration plate and the electrode layer is decreased.

SUMMARY

An advantage of some aspects of the invention is to provide a piezoelectric element which is able to maintain the uniformity of mechanical properties of an electrode and which has an excellent adhesion between the electrode and a member in contact therewith and to provide a liquid ejection head including the piezoelectric element.

The invention was made to solve the problems described above and can be realized by the following aspects or application examples.

One aspect of a piezoelectric element according to the invention comprises: a first electrode containing crystal grains; a piezoelectric layer which contains potassium, sodium, and niobium and which is provided above the first electrode; and a second electrode provided above the piezoelectric layer, and the average grain diameter of the crystal grains is less than 550 nm.

According to the piezoelectric element as described above, since the size of the crystal grains of a material forming the first electrode is sufficiently small, the existence density of grain boundaries is increased, and the denseness thereof is increased. For example, even if potassium and sodium, each of which is charged in an excess amount, overflow without any contribution to the crystallization, the elements may be uniformly absorbed over the entire region of the first electrode. In addition, since the grain boundary is dense, excessive diffusion of potassium and sodium to an adhesion layer can be prevented. As a result, since elements other than the elements forming the crystal in the piezoelectric layer can be excluded, high piezoelectric characteristics and reliability can be obtained. In addition, when the piezoelectric element is used as an actuator, the mechanical properties of the first electrode forming a vibration plate can be uniformed. Furthermore, since excess potassium and sodium are not present in the adhesion layer, the adhesion between a substrate and the first electrode is not degraded. Hence, the actuator may be preferably formed. An adhesion force can be effectively maintained also in a sensor in which during operation, a stress and/or a strain is concentrated on the interface between the piezoelectric layer and the first electrode.

In the piezoelectric element according to the invention, the first electrode may contain a platinum group element as a primary component.

According to the piezoelectric element as described above, a barrier property against potassium or sodium by the first electrode is more preferable.

In the piezoelectric element according to the invention, the first electrode may contain platinum as a primary component.

According to the piezoelectric element as described above, since the barrier property of the crystal grains themselves is higher, the barrier property against potassium or sodium by the first electrode is more preferable.

In the piezoelectric element according to the invention, the first electrode may contain potassium or sodium.

According to the piezoelectric element as described above, since being trapped by the first electrode, potassium or sodium is more suppressed from diffusing from the piezoelectric layer through the first electrode.

In the piezoelectric element according to the invention, the second electrode may contain a platinum group element as a primary component and potassium or sodium.

According to the piezoelectric element as described above, a barrier property against potassium or sodium by the second electrode is further improved, and since being trapped, potassium or sodium is more suppressed from diffusing from the piezoelectric layer through the second electrode.

In the piezoelectric element according to the invention, the average grain diameter of the crystal grains may be 150 nm or less.

According to the piezoelectric element as described above, since the size of the crystal grains of the material forming the first electrode is further decreased, the denseness of the material forming the crystal grain boundaries located between the crystal grains is further increased. As a result, potassium or sodium is more not likely to pass through the first electrode. In addition, since a network of the crystal grain boundaries is finer, the uniformity in change of the mechanical properties can be more improved.

One aspect of a liquid ejection head according to the invention comprises the piezoelectric element described above.

According to the liquid ejection head as described above, since the piezoelectric element described above is included, the uniformity of the mechanical properties of a movable portion is preferable, and in addition, since the adhesion between the vibration plate and the piezoelectric element is not likely to be degraded, the reliability is preferable.

In addition, in the invention, the case in which a specific B member (hereinafter, referred to as "B") is provided "above" or "below" a specific A member (hereinafter, referred to as "A") indicates both the case in which B is directly provided on A at an upper side or a lower side and the case in which B is provided above or below A with another member interposed therebetween. In addition, the case of "provided on A" is also similar to the case of "provided above A". In addition, the case in which B is present above or below A indicates that A and B may be considered to be present as described above when the viewing direction or the viewing angle is changed, and/or when the viewing field is rotated, and the positional relationship between A and B is irrelevant to the gravity action direction.

In addition, in this specification, although expressions, such as "alkali metal (element) diffuses", "potassium diffuses" and "sodium diffuses", are used, those are used to include the cases in which a diffusing material diffuses in the form of a metal, in the form of a compound, and in an unstable state, such as an intermediate (precursor).

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some embodiments of the invention will be described. The following embodiments each will be described as one example of the invention. The invention is not limited to the following embodiments, and various modified embodiments to be implemented without changing the scope of the invention are also included in the invention. In addition, the following constitutions are each not always required to be an essential constitution of the invention.

1. Piezoelectric Element

Figure 1:
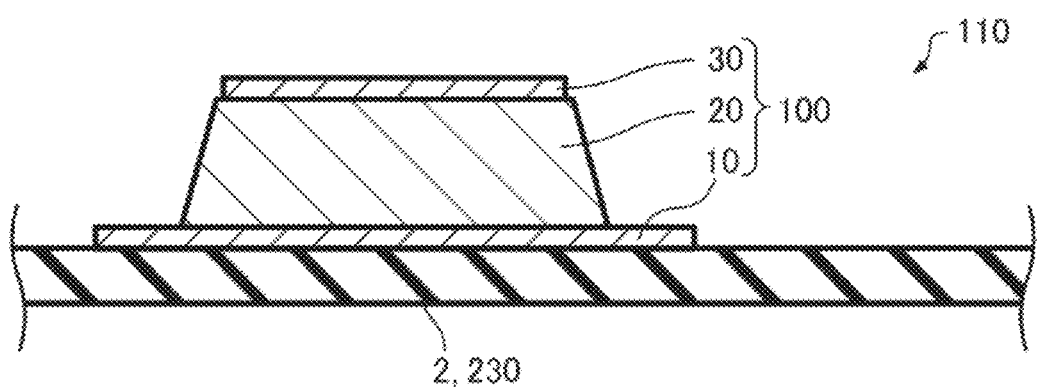
FIG. 1 is a schematic cross-sectional view showing a piezoelectric element according to an embodiment.

A piezoelectric element according to this embodiment will be described with reference to FIG. 1. FIG. 1 is a cross-sectional view schematically showing a piezoelectric element 100 according to this embodiment. The piezoelectric element 100 of this embodiment includes a first electrode 10, a piezoelectric layer 20 provided above the first electrode 10, and a second electrode 30 provided above the piezoelectric layer 20.

1.1. First Electrode

The first electrode 10 is one electrode which applies the voltage to the piezoelectric layer 20. The first electrode 10 may also be called a lower electrode provided under the piezoelectric layer 20. In the example shown in FIG. 1, the first electrode 10 is provided on a substrate 2 (vibration plate 230).

The first electrode 10 has, for example, a layer shape. The film thickness (thickness) of the first electrode 10 is, for example, from 3 to 200 nm. Although a material of the first electrode 10 is not particularly limited as long as having electrical conductivity, for example, a metal or an electrically conductive oxide may be used. The first electrode 10 may have the structure in which layers formed from the material mentioned above by way of example are laminated to each other.

The first electrode 10 preferably contains a platinum group element as a primary component. The platinum group elements are elements in the fifth and the sixth periods of the periodic table and are located in Group VIII, group IX, and Group X, and in particular, ruthenium, rhodium, palladium, osmium, iridium, and platinum may be mentioned. In addition, the "primary component" indicates that the rate of a specific element with respect to the total amount of elements forming a member is 80% or more, preferably 90% or more, more preferably 95% or more, and further preferably 98% or more. Hence, the rate of the platinum group element with respect to the total amount of elements forming the entire first electrode 10 is 80% or more, preferably 90% or more, more preferably 95% or more, and further preferably 98% or more.

When the platinum group element is used as the primary component of the first electrode 10, one or at least two platinum group elements may be used. In this case, the total of the platinum group elements may be set in the range of the primary component. Since the primary component of the first electrode 10 is the platinum group element, the crystal grains of the first electrode 10 have characteristics which are not likely to allow an alkali metal to pass therethrough (high barrier property), and as a result, the alkali metal is more suppressed from diffusing through the first electrode 10. In addition, the primary component of the first electrode 10 is more preferably platinum. Among the platinum group elements, the crystal grains of platinum are more not likely to allow an alkali metal to pass therethrough, and hence, the barrier property can be further improved.

The first electrode 10 includes crystal grains. A material forming the first electrode 10 has crystallinity, and when the first electrode 10 is formed, a polycrystal is obtained. The crystal grain indicates one crystal grain of the polycrystal as described above. On the other hand, when the first electrode 10 is formed of one crystal (single crystal), or when the first electrode 10 is entirely formed of an amorphous film, no crystal grains are formed.

The average grain diameter of the crystal grains of the first electrode 10 is less than 550 nm. Since the average grain diameter of the crystal grains is less than 550 nm, the denseness of a material present in a boundary portion (called "crystal grain boundary" in some cases) between the crystal grains can be maintained high, and an alkali metal can be suppressed from traveling using the crystal grain boundaries as a pathway. In other words, since the material present in the crystal grain boundary is densified, a diffusion rate of the alkali metal to pass therethrough is decreased, and as a result, an effect of enabling the alkali metal to stay can be obtained. In addition, when the average grain diameter of the crystal grains is less than 550 nm, since the volume rate of the crystal grain boundaries in the entire first electrode 10 becomes sufficient, a larger amount of the alkali metal can be trapped. Furthermore, when the average grain diameter of the crystal grains is less than 550 nm, since the mesh of a network formed by connection between the crystal grain boundaries is decreased, the change in mechanical properties of the first electrode 10 caused when the alkali metal is trapped can be more uniformly generated in a plane direction of the first electrode 10.

On the other hand, when the average grain diameter of the crystal grains is 550 nm or more, a crystal portion which is not likely to allow an alkali metal to pass therethrough is increased, and the volume rate of the crystal grain boundaries with respect to the entire first electrode 10 is decreased, and in addition, the density of the material present in the crystal grain boundaries tends to decrease. As a result, the diffusion of the alkali metal along the crystal grain boundaries which are used as a pathway is more likely to occur, and an action of trapping the alkali metal in the crystal grain boundaries is also not likely to be obtained. In addition, when the alkali metal is trapped in the crystal grain boundaries, the difference in mechanical properties of the first electrode 10 in a plane direction is increased, and the uniformity is liable to be degraded.

From the points described above, the average grain diameter of the crystal grains of the first electrode 10 is more preferably 300 nm or less and further preferably 150 nm or less. Although the lower limit of the average grain diameter of the crystal grains is not particularly limited, the lower limit described above is 1 nm or more, preferably 3 nm or more, and more preferably 5 nm or more.

The first electrode 10 may contain potassium or sodium. As described above, although having a property which is not likely to allow potassium and sodium to pass therethrough, the first electrode 10 has a property of trapping (absorbing and/or adsorbing) potassium and/or sodium, and hence, potassium and/or sodium may be contained in the first electrode 10. In other words, the first electrode 10 may contain potassium or sodium as a constituent element.

In addition, the average grain diameter of the crystal grains in this specification is a value to be measured as described below.

The first electrode 10 formed to have a plane shape is observed using a scanning electron microscope (SEM). In this case, the first electrode 10 is observed from the above in an approximately vertical direction. That is, the plane surface of the first electrode 10 is observed. In addition, a viewing field having a square of 2,000 nm by 2,000 nm is arbitrarily selected and is used as a viewing field for the measurement of the average grain diameter. An image (data) in this viewing field is obtained at a resolution (resolution capability) so that the outlines of the crystal grains can be recognized. In addition, in general, since the secondary electron emission efficiency is different between the crystal grain and the crystal grain boundary, while the crystal grains are observed, the data can be obtained at an appropriate magnification. In addition, when the crystal grain boundaries are difficult to observe, the observation may be performed after etching or polishing is carried out so as not to degrade the crystal grains of the first electrode.

Next, at least five crystal grains which are fully placed within the image having a square of 2,000 nm by 2,000 nm thus obtained are arbitrarily selected. Even when the number of crystal grains which are fully placed within the image is one to four, the average grain diameter can be calculated. In addition, when the number of crystal grains which are fully placed within the image is less than one (zero), without calculating the average, the average grain diameter is assumed to be 1,000 nm.

A maximum span length of each of the crystal grains thus selected is measured. The maximum span length is defined as the length of the maximum linear line component which is obtained in such a way that after the outline of the crystal grain is defined, the maximum linear component is selected from linear components which are drawn between two points located on the outline of the crystal grain so as not to extend over the outline thereof. In addition, the maximum span lengths of the crystal grains thus obtained are averaged, and this average value is regarded as the average grain diameter of the crystal grains of the first electrode 10.

1.2. Piezoelectric Layer

The piezoelectric layer 20 is provided above the first electrode 10. In the example shown in FIG. 1, the piezoelectric layer 20 is provided on the first electrode 10. The film thickness of the piezoelectric layer 20 is, for example, from 100 nm to 3 µm. When the voltage is applied between the first electrode 10 and the second electrode 30, the piezoelectric layer 20 can be deformed. The piezoelectric layer 20 has a perovskite crystal structure, and by application of the voltage, the electromechanical conversion effect is obtained.

The piezoelectric layer 20 contains potassium (K), sodium (Na), and niobium (Nb). The piezoelectric layer 20 may also contain other elements, such as titanium (Ti), zirconium (Zr), and iron (Fe). When K, Na, and Nb form a perovskite crystal structure, K and Na are likely to be disposed at the A site, and Nb is likely to be disposed at the B site.

The piezoelectric layer 20 of this embodiment contains potassium and sodium each of which is an alkali metal. Since having a relatively high diffusion coefficient (low activation energy) as compared to that of each of other elements contained in the piezoelectric layer 20, potassium and sodium are likely to travel in the piezoelectric layer 20. In addition, potassium and sodium are likely to diffuse out of the piezoelectric layer 20. Furthermore, when the piezoelectric layer 20 is formed by crystallization, potassium is not likely to be disposed at the A site of a growing crystal and is liable not to stay at the A site. Hence, also in the case of KNN, as is the case of the other piezoelectric material, raw materials of potassium and sodium for the A site are each charged in an excess amount and are then fired. Since the raw materials of potassium and sodium are each charged in an excess amount, the probability that potassium and sodium are brought into contact with niobium forming the B site is increased in the crystallization process, and the crystallization rate and the crystallinity can be improved. In this regard, a potassium precursor (six oxygen atoms coordinate to potassium) in crystallization has a molecular radius larger than that of a sodium precursor (six oxygen atoms coordinate to sodium) and is more not likely to be fitted to the lattice spacing of a crystal to be formed. From the point described above, between potassium and sodium, the potassium raw material is more preferably charged in a more excess amount.

As described above, also in the piezoelectric element 100 of this embodiment, the raw materials of the alkali metals (potassium and sodium) are excessively charged (in excess amounts) than those of the stoichiometric composition and are then fired. As a result, excess potassium and sodium are more likely to be generated, and the diffusion thereof is further required to be suppressed.

As described above, since the first electrode 10 is not likely to allow potassium and sodium to pass therethrough and is able to trap (absorb) potassium and sodium, potassium and sodium which are about to diffuse from the piezoelectric layer 20 can be absorbed or blocked. Hence, the excess amounts of potassium and sodium generated in the piezoelectric layer 20 are not likely to diffuse through the first electrode 10 and are not likely to reach other members (such as the vibration plate).

1.3. Second Electrode

The second electrode 30 is provided above the piezoelectric layer 20. In the example shown in FIG. 1, the second electrode 30 is provided on the piezoelectric layer 20. The second electrode 30 is another electrode which applies the voltage to the piezoelectric layer 20. The second electrode 30 is an upper electrode provided on the piezoelectric layer 20.

The second electrode 30 has, for example, a layer shape. The film thickness of the second electrode 30 is, for example, from 50 nm to 300 nm. The second electrode 30 is, for example, a metal layer, such as an iridium layer or a platinum layer, an electrically conductive oxide layer thereof (such as an iridium oxide layer), or a strontium ruthenate layer. The second electrode 30 may have the structure in which layers each described above by way of example are laminated to each other.

Among those layers described above, the second electrode 30 is preferably formed of a platinum group element as a primary component. That is, the rate of the platinum group element with respect to the total amount of elements forming the entire second electrode 30 is 80% or more, preferably 90% or more, more preferably 95% or more, and further preferably 98% or more.

Since the primary component of the second electrode 30 is the platinum group element, the second electrode 30 has a property (high barrier property) which is not likely to allow an alkali metal to pass therethrough, and hence, the alkali metal can be suppressed from diffusing through the second electrode 30. In addition, the primary component of the second electrode 30 is further preferably platinum. Among the platinum group elements, platinum is more not likely to allow an alkali metal to pass therethrough and can further enhance the barrier property.

The second electrode 30 may also include crystal grains as is the first electrode 10. Accordingly, an action of allowing potassium and sodium to stay in the crystal grain boundaries can be obtained. In addition, the second electrode 30 may also include no crystal grains. The second electrode 30 may have a film shape (not polycrystal) formed of iridium oxide or the like.

The second electrode 30 may contain potassium or sodium. When being formed using the platinum group element, since the second electrode 30 has a property of trapping (absorbing or adsorbing) potassium and/or sodium, potassium or sodium may be contained in the second electrode 30. In other words, the second electrode 30 may contain potassium or sodium as a constituent component. Accordingly, potassium and sodium which are about to diffuse from the piezoelectric layer 20 can be absorbed or blocked. Hence, excess potassium and sodium generated in the piezoelectric layer 20 are not likely to diffuse through the second electrode 30.

1.4. Other Constitutions

The piezoelectric element 100 is formed, for example, on the substrate 2. The substrate 2 is a flat plate formed, for example, from a semiconductor or an insulating material. The substrate 2 may have either a single layer structure or a laminate structure in which layers are laminated to each other. As long as an upper surface of the substrate 2 has a flat shape, the inside structure thereof is not particularly limited, and for example, the structure in which at least one space or the like is formed may also be used.

The substrate 2 may be a vibration plate 230 which has flexibility and which can be deformed (displaced) by the operation of the piezoelectric layer 20 or may have a more complicated structure including the vibration plate 230 described above. The vibration plate 230 is, for example, a silicon oxide layer, a zirconium oxide layer, or a laminate thereof (such as a laminate in which the zirconium oxide layer is provided on the silicon oxide layer). In addition, although not shown in the FIG. 1, an adhesion layer which improves the adhesion between the first electrode 10 and the substrate 2 may be provided therebetween. The adhesion layer is, for example, a titanium layer or a titanium oxide layer.

In addition, in this specification, as is the example shown in FIG. 1, a member formed from the substrate 2 (vibration plate 230) and the piezoelectric element 100 is called an actuator 110 in some cases. The actuator 110 can be bent or vibrated when the piezoelectric element 100 is deformed. In addition, since the vibration plate of the actuator 110 forms a part of a wall defining a pressure generation chamber of a liquid ejection head which will be described later, the volume of the pressure generation chamber can be changed in accordance with a signal to be input.

As a piezoelectric actuator which applies the pressure to a liquid in the pressure generation chamber, the actuator 110 may be used, for example, for a liquid ejection head or a printer using the liquid ejection head. In addition, the piezoelectric element 100 may be used, for example, for a piezoelectric sensor (an ultrasonic sensor or a gyro sensor) which detects the deformation of the piezoelectric layer as an electric signal.

2. Method for Manufacturing Piezoelectric Element

Next, a method for manufacturing the piezoelectric element 100 according to this embodiment will be described.

First, the substrate 2 is prepared. In particular, a silicon substrate is thermally oxidized to form a silicon oxide layer. Next, a zirconium layer is formed on the silicon oxide layer by a sputtering method or the like and is then thermally oxidized, so that a zirconium oxide layer is formed. By the steps described above, the substrate 2 can be prepared.

Next, the first electrode 10 is formed on the substrate 2. The first electrode 10 is formed, for example, by a sputtering method or a vacuum deposition method. The crystal grains of the first electrode 10 are formed in this step. The average grain diameter of the crystal grains is changed by a significantly large number of factors. For example, by the material of the substrate 2, the surface treatment (condition) of the substrate 2, the type of film forming apparatus, the film forming conditions (target, the temperature of the substrate 2 in film formation, an electric power to be input, the inside pressure of a chamber, an environmental gas, the presence or absence of assist, the distance between the target and the substrate, and the like), the heat treatment after the film formation, and the like, the average grain diameter of the crystal grains can be changed. Furthermore, since the average grain diameter is influenced independently by each of those conditions or is influenced while those conditions relate to each other in combination, a definitive index that controls the size of the crystal grains cannot be easily determined. In addition, in the following experimental examples which will be described later, after the conditions used for the experiments are comprehensively taken into consideration, the average grain diameter is changed by the substrate temperature in the film formation; however, when the type of apparatus and/or the condition is changed, the average grain diameter may not be changed in some cases even if the substrate temperature is changed.

Next, the piezoelectric layer 20 is formed on the first electrode 10. The piezoelectric layer 20 is formed, for example, by a liquid phase method (chemical solution method), such as a sol-gel method or a metal organic deposition (MOD) method.

In particular, a metal complex containing K, a metal complex containing Na, and a metal complex containing Nb and if needed, a metal complex containing Ti, a metal complex containing Zr, and the like are dissolved or dispersed in an organic solvent, so that a precursor solution is prepared.

The precursor solution thus prepared is applied on the first electrode 10 using a spin coating method or the like to form a precursor layer (coating step). Next, the precursor layer is heated at 130° C. to 250° C. and is dried for a predetermined time (drying step). Furthermore, the precursor layer thus dried was heated, for example, at 300° C. to 450° C. and is held for a predetermined time for degreasing (degreasing step). Next, the degreased precursor layer is heated, for example, at 650° C. to 800° C. and is then held at this temperature for a predetermined time, so that the precursor layer is crystallized (firing step).

By the steps described above, the piezoelectric layer 20 is formed on the first electrode 10. In addition, by repeatedly performing a series of steps from the coating step to the firing step a plurality of times, the piezoelectric layer 20 may also be formed from a plurality of layers. As a heating apparatus used in the drying step, the degreasing step, and the firing step to form the piezoelectric layer 20, for example, a rapid thermal annealing (RTA) apparatus which performs heating using an infrared lamp may be mentioned.

As the metal complex containing K, for example, potassium 2-ethylhexanoate or potassium acetate may be mentioned. As the metal complex containing Na, for example, sodium 2-ethylhexanoate or sodium acetate may be mentioned. As the metal complex containing Nb, for example, niobium 2-ethylhexanoate or pentaethoxyniobium may be mentioned. In addition, at least two types of metal complexes may be used in combination. For example, as the metal complex containing potassium, potassium 2-ethylhexanoate and potassium acetate may be used in combination.

As the solvent, for example, propanol, butanol, pentanol, hexanol, octanol, ethylene glycol, propylene glycol, octane, decane, cyclohexane, xylene, toluene, tetrahydrofuran, acetic acid, octyl acid, 2-n-butoxyethanol, n-octane, or a mixed solvent thereof may be mentioned.

Next, the piezoelectric layer 20 is patterned. As a result, as shown in FIG. 1, the piezoelectric layer 20 and the first electrode 10 each can be formed to have a predetermined shape. The patterning is performed, for example, by photolithography and etching. In addition, the patterning may be performed after a film to be used as the second electrode 30 is formed.

Next, the second electrode 30 is formed on the piezoelectric layer 20. The second electrode 30 is formed, for example, by film formation using a sputtering method or a vacuum deposition method and by patterning using photolithography and etching.

By the steps described above, the piezoelectric element 100 can be manufactured. In the case in which the substrate 2 is the vibration plate 230, or in the case in which the substrate 2 is further processed to form the vibration plate 230, for example, at least one appropriate step may be added to the steps described above, so that the actuator 110 can be manufactured.

In addition, although the example in which the piezoelectric layer 20 is formed by a liquid phase method has been described, the method for forming the piezoelectric layer 20 is not particularly limited, and for example, a chemical vapor deposition (CVD) method or a sputtering method may also be used.

3. Liquid Ejection Head

Figure 2:
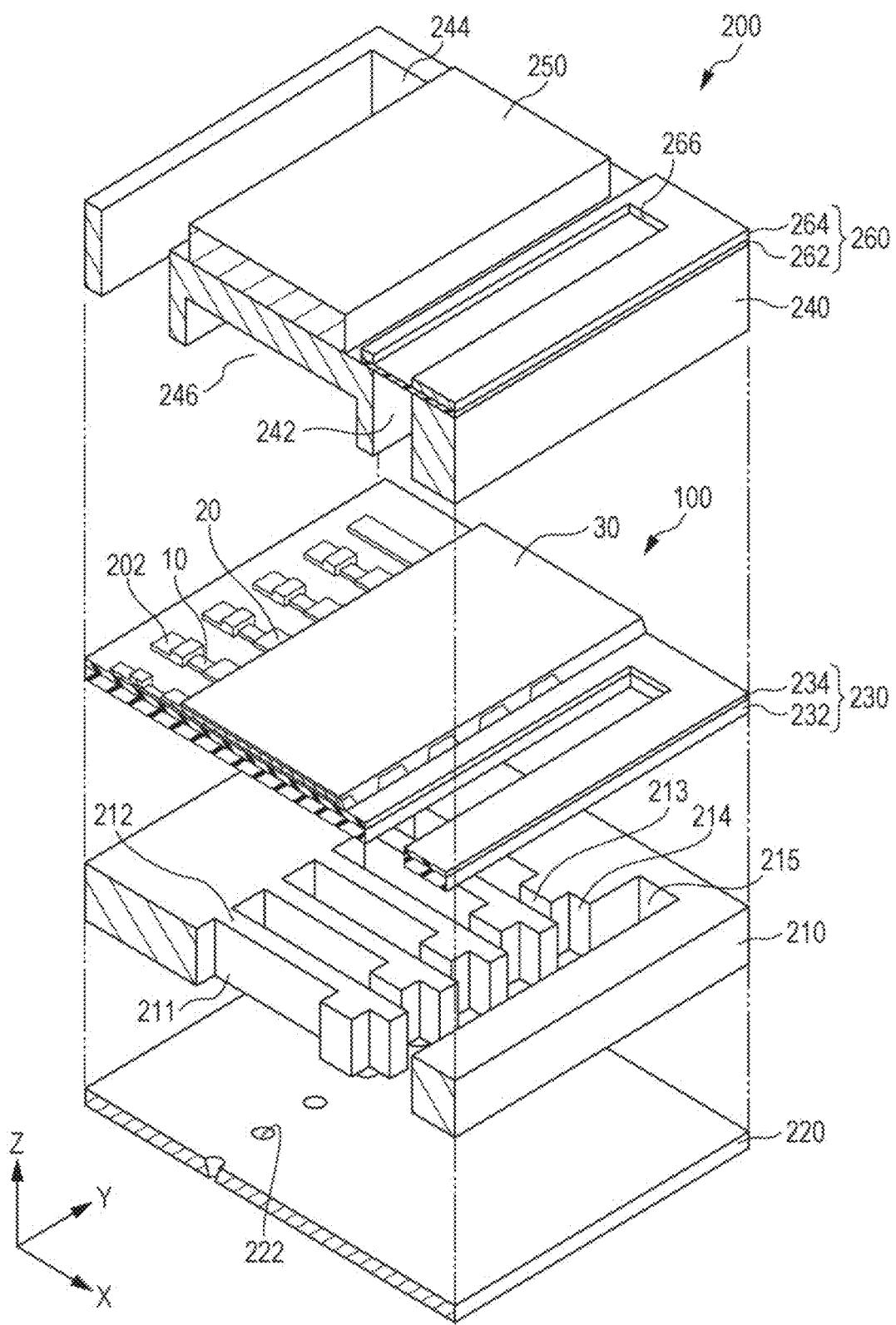
FIG. 2 is an exploded perspective view schematically showing a liquid ejection head according to an embodiment.
Figure 3:
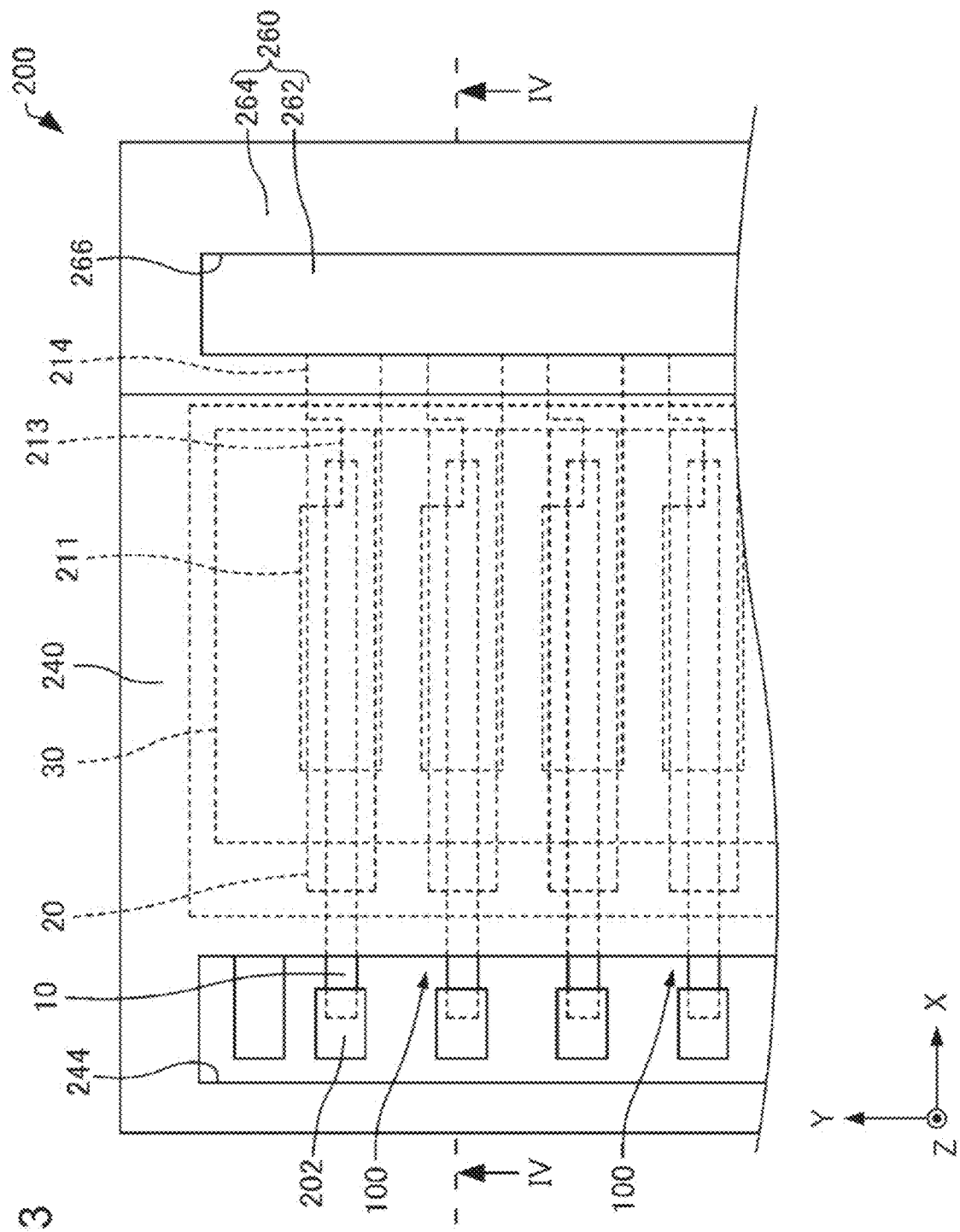
FIG. 3 is a plan view schematically showing the liquid ejection head according to the embodiment.
Figure 4:
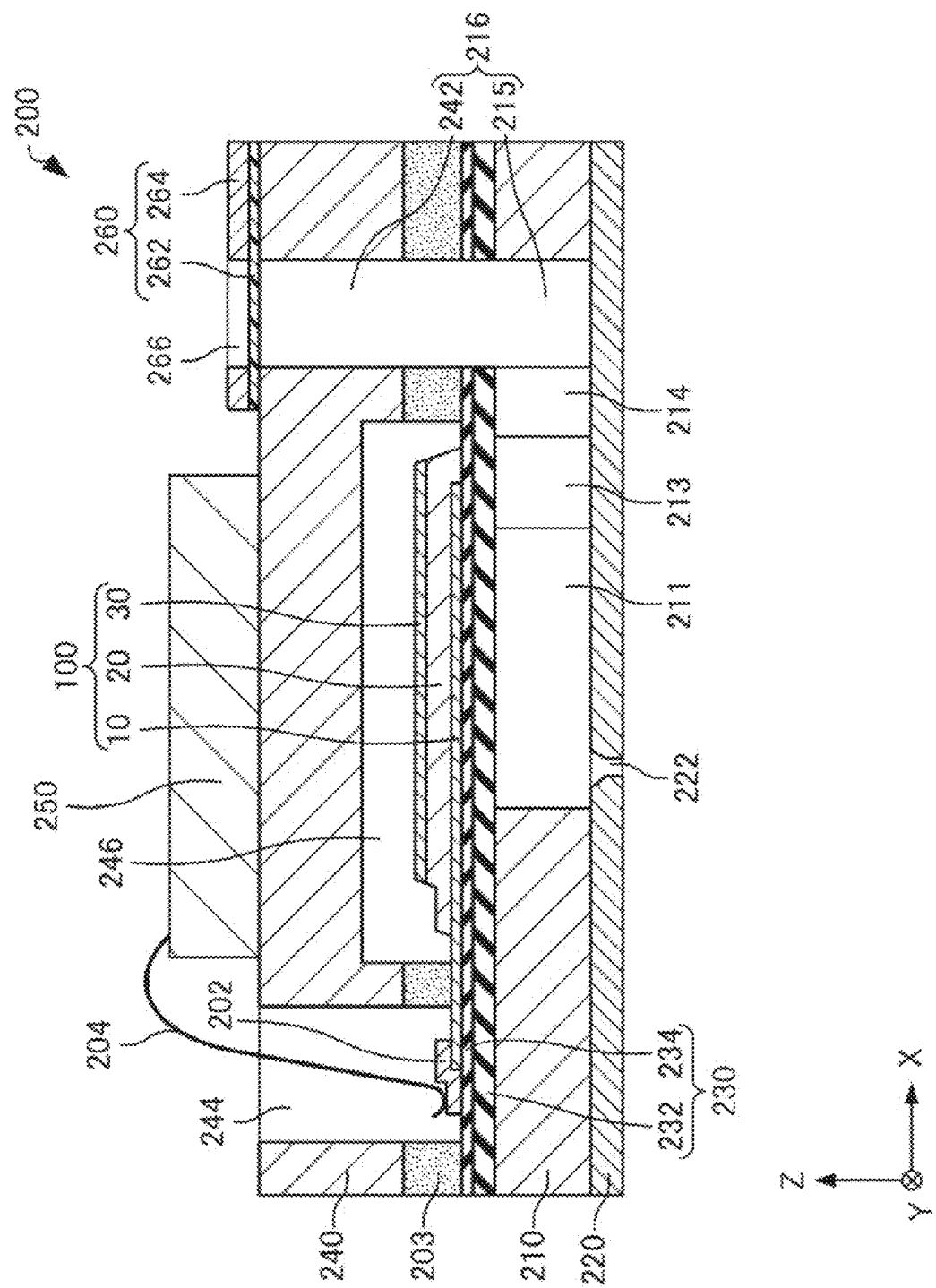
FIG. 4 is a cross-sectional view schematically showing the liquid ejection head according to the embodiment.

Next, a liquid ejection head according to this embodiment will be described with reference to the drawings. FIG. 2 is an exploded perspective view schematically showing a liquid ejection head 200 according to this embodiment. FIG. 3 is a plan view schematically showing the liquid ejection head 200 according to this embodiment. FIG. 4 is a schematic cross-sectional view of the liquid ejection head 200 taken along the line IV-IV in FIG. 3. In addition, in FIGS. 2 to 4, as the three axes orthogonal to each other, an X axis, a Y axis, and a Z axis are shown.

The liquid ejection head according to the invention includes the piezoelectric element 100 described above or the actuator 110 described above. Hereinafter, as one example, the liquid ejection head 200 including the piezoelectric elements 100 will be described.

As shown in FIGS. 2 to 4, the liquid ejection head 200 includes, for example, the piezoelectric elements 100, a flow path forming substrate 210, a nozzle plate 220, the vibration plate 230, a protective substrate 240, a circuit substrate 250, and a compliance substrate 260. In addition, for convenience, in FIG. 3, the circuit substrate 250 and connection wires 204 are omitted.

The flow path forming substrate 210 is, for example, a silicon substrate. In the flow path forming substrate 210, pressure generation chambers 211 are provided. The pressure generation chambers 211 are separated from each other by a plurality of partitions 212.

In the flow path forming substrate 210, at an end portion of the pressure generation chamber 211 at a +X axis direction side, an ink supply path 213 and a communication path 214 are provided. The ink supply path 213 is formed so that its opening area is decreased by squeezing the end portion of the pressure generation chamber 211 at the +X axis direction side in a Y axis direction. The size of the communication path 214 in the Y axis direction is, for example, the same as that of the pressure generation chamber 211 in the Y axis direction. At the +X axis direction side of the communication path 214, a communication portion 215 is provided. The communication portion 215 forms a part of a manifold 216. The manifold 216 is used as a common ink chamber for the pressure generation chambers 211. As described above, in the flow path forming substrate 210, liquid flow paths each formed from the pressure generation chamber 211, the ink supply path 213, the communication path 214, and the communication portion 215 are formed.

The nozzle plate 220 is provided on one surface (surface located at a −Z axis direction side) of the flow path forming substrate 210. A material of the nozzle plate 220 is, for example, Steel Use Stainless (SUS). The nozzle plate 220 is bonded to the flow path forming substrate 210 with an adhesive, a heat welding film, or the like. In the nozzle plate 220, nozzle openings 222 are provided along the Y axis. The nozzle openings 222 are configured to communicate with the respective pressure generation chambers 211.

The vibration plate 230 is provided on the other surface (surface at a +Z axis direction side) of the flow path forming substrate 210. The vibration plate 230 is formed, for example, of a first insulating layer 232 formed on the flow path forming substrate 210 and a second insulating layer 234 provided on the first insulating layer 232. The first insulating layer 232 is, for example, a silicon oxide layer. The second insulating layer 234 is, for example, a zirconium oxide layer.

The piezoelectric element 100 is provided, for example, on the vibration plate 230. A plurality of the piezoelectric elements 100 is provided. The number of the piezoelectric elements 100 is not particularly limited.

In the liquid ejection head 200, by the deformation of the piezoelectric layer 20 having electromechanical conversion characteristics, the vibration plate 230 and the first electrode 10 are displaced. That is, in the liquid ejection head 200, the vibration plate 230 and the first electrode 10 substantially function as the vibration plate. In addition, the vibration plate 230 may be omitted so that the first electrode 10 only functions as the vibration plate. When the first electrode 10 is directly provided on the flow path forming substrate 210, the first electrode 10 is preferably protected by an insulating protective film or the like so that an ink is not brought into contact with the first electrode 10.

The first electrodes 10 are each formed as an independent discrete electrode for each pressure generation chamber 211. The size of the first electrode 10 in the Y axis direction is smaller than the size of the pressure generation chamber 211 in the Y axis direction. The size of the first electrode 10 in an X axis direction is larger than the size of the pressure generation chamber 211 in the X axis direction. In the X axis direction, the two end portions of the first electrode 10 are located outside from the two end portions of the pressure generation chamber 211. To the end portion of the first electrode 10 at a −X axis direction side, a lead electrode 202 is connected.

The size of the piezoelectric layer 20 in the Y axis direction is, for example, larger than the size of the first electrode 10 in the Y axis direction. The size of the piezoelectric layer 20 in the X axis direction is, for example, larger than the size of the pressure generation chamber 211 in the X axis direction. The end portion of the piezoelectric layer 20 at the +X axis direction side is located, for example, outside (at the +X axis direction side) from the end portion of the first electrode 10 at the +X axis direction side. That is, the end portion of the first electrode 10 at the +X axis direction side is covered with the piezoelectric layer 20. On the other hand, the end portion of the piezoelectric layer 20 at the −X axis direction side is located, for example, inside (at the +X axis direction side) from the end portion of the first electrode 10 at the −X axis direction side. That is, the end portion of the first electrode 10 at the −X axis direction side is not covered with the piezoelectric layer 20.

The second electrode 30 is continuously provided on the piezoelectric layers 20 and the vibration plate 230. The second electrode 30 is formed as a common electrode commonly used for the piezoelectric elements 100. In addition, although not shown in the drawings, instead of the second electrode 30, the first electrode 10 may be used as a common electrode.

The protective substrate 240 is bonded to the flow path forming substrate 210 with an adhesive 203 interposed therebetween. In the protective substrate 240, a through-hole 242 is provided. In the example shown in the drawings, the through-hole 242 penetrates the protective substrate 240 in a Z axis direction and communicates with the communication portion 215. The through-hole 242 and the communication portion 215 collectively form the manifold 216 to be used as a common ink chamber for the pressure generation chambers 211. Furthermore, in the protective substrate 240, a through-hole 244 penetrating the protective substrate 240 in the Z axis direction is provided. In the through-hole 244, the end portions of the lead electrodes 202 are located.

In the protective substrate 240, an opening portion 246 is provided. The opening portion 246 is a space so as not to disturb the operation of the piezoelectric elements 100. The opening portion 246 may be either sealed or not sealed.

The circuit substrate 250 is provided on the protective substrate 240. In the circuit substrate 250, a semiconductor integrated circuit (IC) which drives the piezoelectric elements 100 is included. The circuit substrate 250 is electrically connected to the lead electrodes 202 with the connection wires 204 interposed therebetween.

The compliance substrate 260 is provided on the protective substrate 240. The compliance substrate 260 includes a sealing layer 262 provided on the protective substrate 240 and a fixing plate 264 provided on the sealing layer 262. The sealing layer 262 is a layer sealing the manifold 216. The sealing layer 262 has, for example, flexibility. In the fixing plate 264, a through-hole 266 is provided. The through-hole 266 penetrates the fixing plate 264 in the Z axis direction. The through-hole 266 is provided at a position overlapped with the manifold 216 when viewed in plan (viewed in the Z axis direction).

Since the liquid ejection head 200 includes the above piezoelectric elements 100, the mechanical properties of the movable portion (the first electrode, the vibration plate, or the actuator) are uniformly distributed, and the adhesion between the vibration plate and the piezoelectric element is not likely to be degraded, so that the reliability is preferable.

4. Examples

Hereinafter, although the invention will be described in more detail with reference to experimental examples, the invention is not limited thereto.

4.1. Film Formation of First Electrode and Evaluation of Average Grain Diameter

Figure 5:
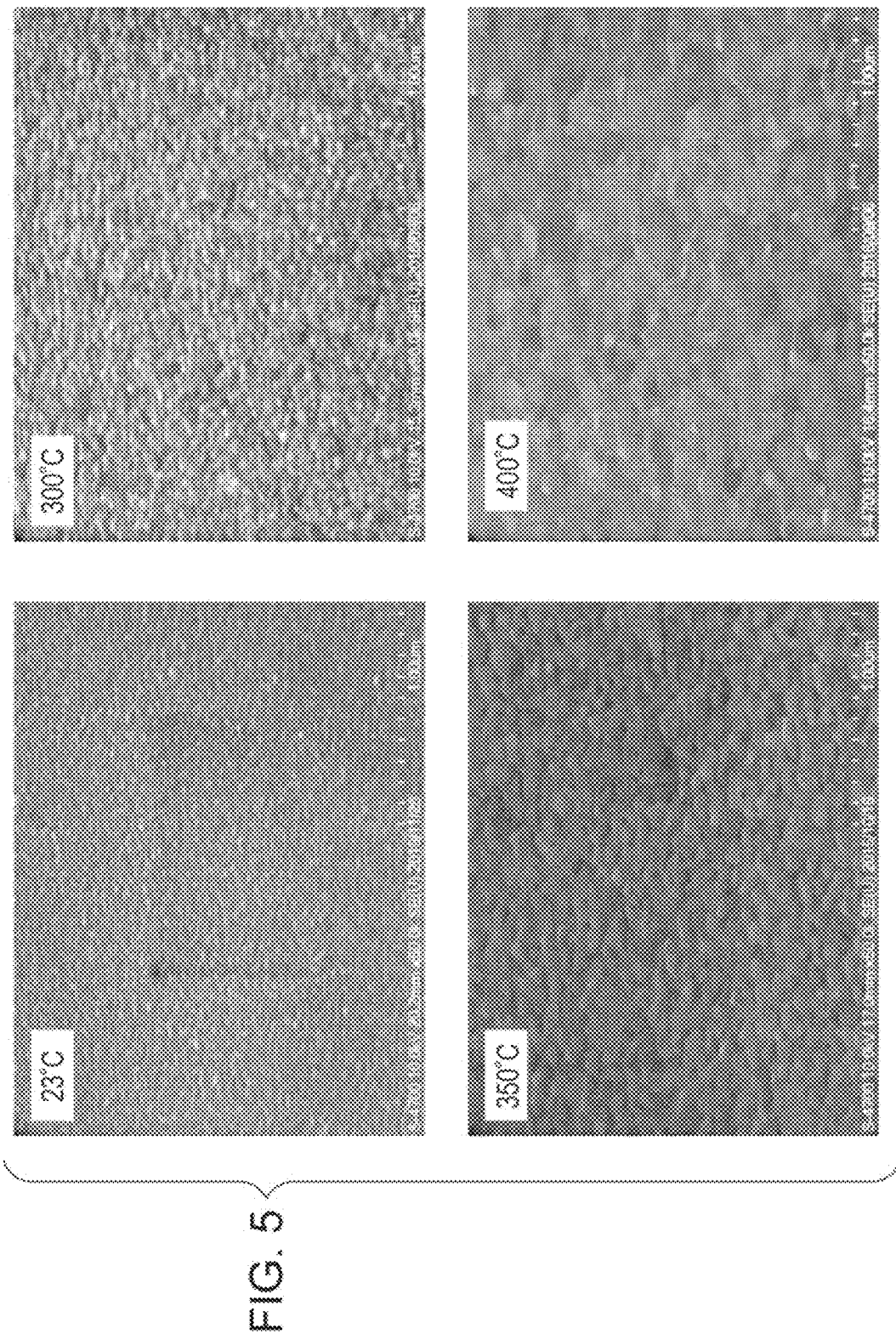
FIG. 5 includes SEM photos of electrodes of experimental examples.
Figure 6:
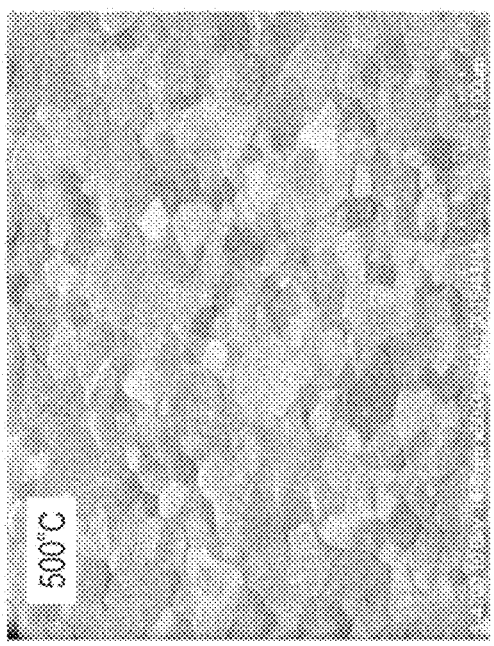
FIG. 6 includes SEM photos of electrodes of experimental examples.
Figure 6:
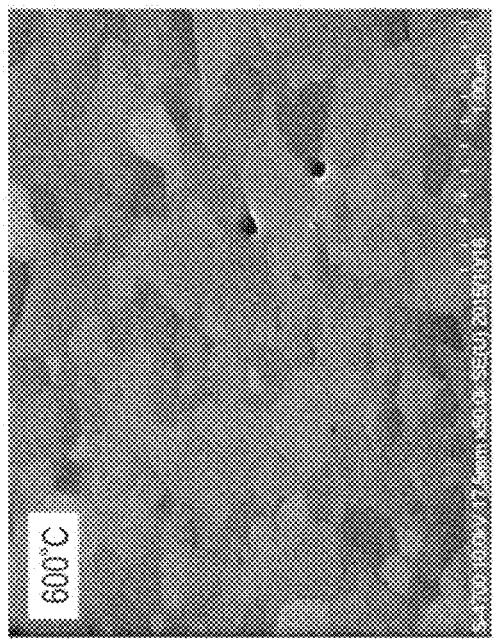
Figure 6:
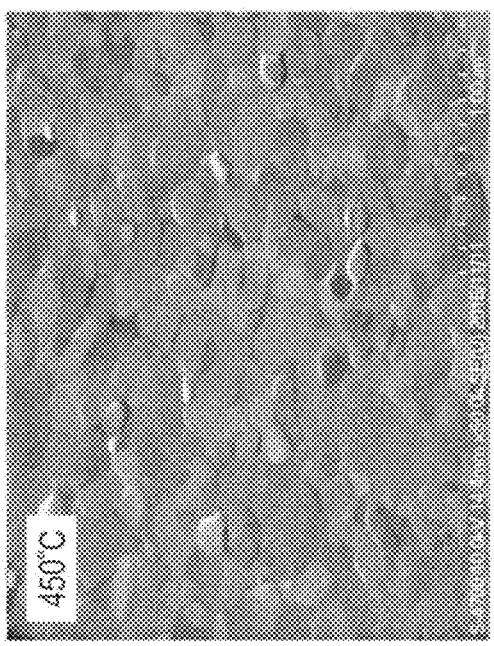

A silicon oxide layer and a zirconium oxide layer were laminated on a silicon substrate, and this laminate was prepared as a substrate used in each experiment. After the substrate was placed in a chamber of an RF magnetron type sputtering apparatus (manufactured by Canon Anelva Corporation, Model No. FC7000), by changing the substrate temperature as shown in Table 1, a first electrode was formed on the substrate using platinum as a target under conditions in which the flow rate of argon, the inside pressure of the chamber, the distance between the substrate and the target, and the electric power were set to 50 sccm, 2 Pa, 100 mm, and 200 W, respectively. The crystal grain diameter of the first electrode was mainly dependent on the substrate temperature, the gas pressure in the chamber, and the electric power and tended to increase as the substrate temperature was increased, as the gas pressure in the chamber was reduced, and as the electric power was increased. The grain diameter control was performed by optimizing those factors so that the efficiency was matched with the film formation rate which was a factor of influencing the crystal orientation. The first electrodes formed at the respective substrate temperatures were observed using a SEM (manufactured by Hitachi High-Technologies Corporation, Model No. S-4700), and the observation results thus obtained are shown in FIGS. 5 and 6 (the substrate temperatures are also shown in the drawings). In addition, the average grain diameter of the crystal grains of the first electrode formed at each substrate temperature is also shown in Table 1. After five crystal grains which were fully placed within an image having a square of 2,000 nm by 2,000 nm were arbitrarily selected, the maximum span length of each crystal grain thus selected was measured, and the average value thereof was regarded as the average grain diameter of the crystal grains of the first electrode.

TABLE 1

| | EXPERIMENT NO. | | | | | | | | |
|---|---|---|---|---|---|---|---|---|---|
| | 1 | 2 | 3 | 4 | 5 | 6 | 7 | 8 | 9 |
| SUBSTRATE TEMPERATURE (° C.) | 23 | 23 | 23 | 23 | 350 | 350 | 350 | 350 | 450 |
| AVERAGE GRAIN DIAMETER (nm) | 20 | 20 | 20 | 20 | 150 | 150 | 150 | 150 | 300 |
| EXCESS RATIO OF A SITE RAW MATERIAL OF KNN | 1.00 | 1.05 | 1.10 | 1.20 | 1.00 | 1.05 | 1.10 | 1.20 | 1.00 |
| NATURAL FREQUENCY (MHz) | 2 | 1.8 | 1.6 | 1.4 | 2 | 1.8 | 1.6 | 1.4 | 2 |
| VARIATION RANGE | ±3% | ±3% | ±3% | ±5% | ±3% | ±5% | ±5% | ±8% | ±5% |
| ELECTRODE ADHESION FORCE (MPa) | 35 | 30 | 25 | 20 | 35 | 30 | 25 | 20 | 35 |
| VARIATION RANGE | ±5% | ±5% | ±7% | ±10% | ±5% | ±10% | ±15% | ±20% | ±10% |

| | EXPERIMENT NO. | | | | | | |
|---|---|---|---|---|---|---|---|
| | 10 | 11 | 12 | 13 | 14 | 15 | 16 |
| SUBSTRATE TEMPERATURE (° C.) | 450 | 450 | 450 | 600 | 600 | 600 | 600 |
| AVERAGE GRAIN DIAMETER (nm) | 300 | 300 | 300 | 550 | 550 | 550 | 550 |
| EXCESS RATIO OF A SITE RAW MATERIAL OF KNN | 1.05 | 1.10 | 1.20 | 1.00 | 1.05 | 1.10 | 1.20 |
| NATURAL FREQUENCY (MHz) | 1.8 | 1.6 | 1.4 | 2 | 1.8 | 1.6 | 1.4 |
| VARIATION RANGE | ±7% | ±7% | ±10% | ±10% | ±13% | ±15% | ±30% |
| ELECTRODE ADHESION FORCE (MPa) | 30 | 25 | 20 | 30 | 25 | 20 | 15 |
| VARIATION RANGE | ±15% | ±20% | ±25% | ±25% | ±25% | ±30% | ±30% |

4.2. Evaluation of Piezoelectric Layer

Figure 7A:
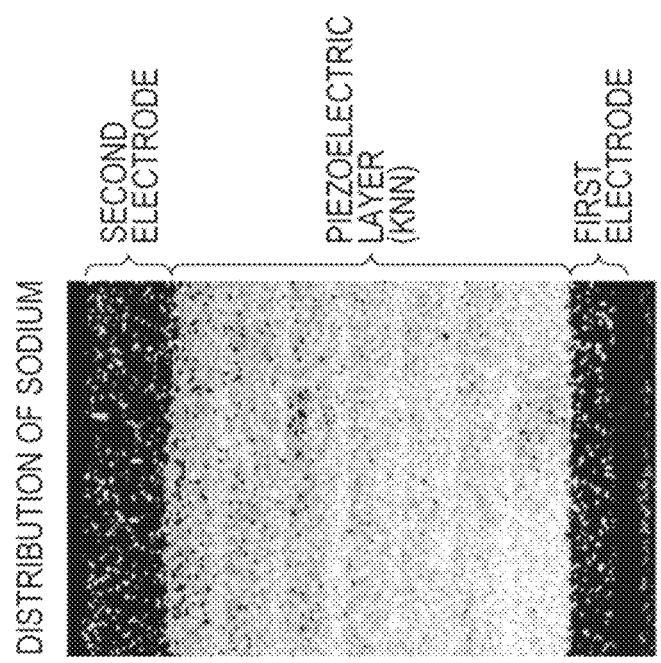
FIGS. 7A and 7B each show a cross-sectional TEM-EDX data of a piezoelectric element according to an experimental example.
Figure 7B:
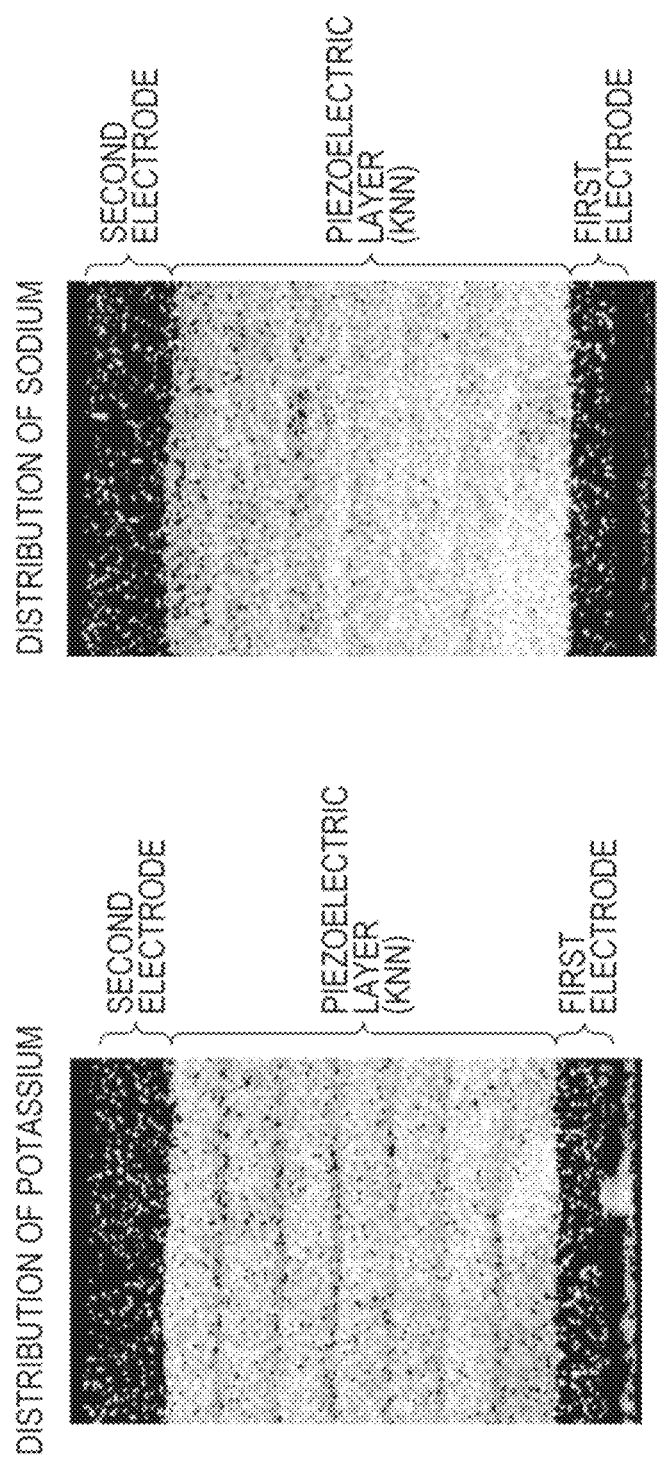

A piezoelectric layer was formed on each first electrode at an excess ratio of A site element shown in Table 2, and a second electrode was further formed by platinum sputtering. A cross-section of a laminate thus obtained was observed using a transmission electron microscope-energy dispersive X-ray (TEM-EDX) analysis apparatus (manufactured by FEI Company, Model No. TecnaiG2F30), and the results of evaluation of the distribution state of potassium and sodium are shown in FIGS. 7A and 7B. White dots observed in the photo indicate atoms of potassium and sodium or atomic groups in which potassium atoms and sodium atoms are aggregated. Although potassium and sodium were naturally distributed in the piezoelectric layer, it was confirmed that potassium was also present in the first electrode, an adhesion layer located at a lower position of the first electrode, and the second electrode. As is the case described above, it was also confirmed that sodium diffused out of the piezoelectric layer. However, the diffusion amount of sodium into the adhesion layer is not so large as compared to that of potassium. The diffusion amounts of potassium and sodium into the first electrode, the second electrode, and the adhesion layer were evaluated using the cross-sectional TEM-EDX image shown in FIGS. 7A and 7B.

4.3. Evaluation of Physical Properties of First Electrode

The adhesion force between the first electrode and the substrate of the laminate obtained in the above "4.2." was measured by a thin-film adhesion strength measurement apparatus (manufactured by Phototechnica Corporation, Model No. Romulus IV) using a Sebastian method. In addition, silicon of the substrate was etched to form a laminate (vibration plate) of silicon oxide, zirconium oxide, the first electrode, the piezoelectric layer, and the second electrode, and the natural frequency thereof was measured. The natural frequency of the vibration plate was obtained by measuring the cycle of residual vibration of the vibration plate using a Doppler displacement meter (manufactured by Polytec, Model No. NLV-2500). In addition, by the use of an impedance analyzer (manufactured by Agilent, Model No. 4294A), the natural frequency was obtained from a frequency of an alternating-current power source in electrical resonance which was synchronized with the mechanical resonance (natural vibration). Although the absolute value of the natural frequency of the vibration plate is determined by the film thickness and the Young's modulus of a material forming the vibration plate, even if a film which forms the vibration plate is prepared by any one of a sputtering method and a liquid phase method, the variation in film thickness can be controlled within less than 1 nm. Compared to the variation in natural frequency caused by the variation in film thickness, the variation in natural frequency caused by the variation in Young's modulus of the electrode, which is caused by the variation in diffusion amount of potassium and sodium into the first electrode and/or the second electrode, is large, and as a result, the product performance is seriously influenced. That is, the variation in natural frequency of the vibration plate can be a variation factor of the flexural rigidity of the actuator and has an influence on the displacement characteristics. As described above, the diffusion amount into the electrode is depend on the crystal grain diameter (grain boundary density and denseness) of the crystal grains forming the electrode, and hence, the product performance is depend on the grain diameter of the crystal grains of the electrode. The measurement results of the crystal grain diameter of the electrode, the variation in natural frequency of the vibration plate, and the adhesion force between the first electrode and the substrate are shown in Table 1.

4.4. Evaluation Results

As shown in Table 1, in Experiments 1 to 12 in which the average grain diameter of the crystal grains of platinum of the first electrode was less than 550 nm, the adhesion forces each between the first electrode and the substrate were all excellent. From the results described above, it is believed that the alkali metal is sufficiently trapped in the crystal grain boundaries. On the other hand, in Experiments 13 to 16 in which the average grain diameter was 550 nm or more, the adhesion forces each between the first electrode and the substrate were all decreased, and in addition, the error (nonuniformity) was also increased.

In addition, from Table 1, in all the experiments, although the central values of the natural frequencies in the respective substrate temperature ranges were approximately equivalent to each other, compared to Experiments 1 to 12 in which the average grain diameter of the crystal grains of platinum of the first electrode was less than 550 nm, in Experiments 13 to 16 in which the average grain diameter was 550 nm or more, the variation was seriously large. The reason for this is believed that the roughness of the network of the crystal grain boundaries is partially responsible.

In addition, from the results shown in FIGS. 7A and 7B, white dots (bright points) were observed in the first electrode and the second electrode, and the presence of potassium and sodium was confirmed. That is, it was found that the alkali metals derived from the piezoelectric layer were effectively absorbed (trapped) by the first electrode and the second electrode.

The invention is not limited to the embodiments described above and may be variously changed and/or modified. For example, the invention includes substantially the same constitution (for example, the function, the method, and/or the result has the same constitution, or the purpose and/or the effect has the same constitution) as that described in at least one of the embodiments. In addition, the invention includes a constitution in which a nonessential portion of the constitution described in at least one of the embodiments is replaced with something else. In addition, the invention includes a constitution capable of obtaining the same functional effect or achieving the same purpose as that of the constitution described in at least one of the embodiments. In addition, the invention includes a constitution in which a known technique is added to the constitution described in at least one of the embodiments.

What is claimed is:

1. A piezoelectric element comprising:
   a first electrode containing crystal grains;
   a piezoelectric layer which contains potassium, sodium, and niobium and which is provided above the first electrode; and
   a second electrode provided above the piezoelectric layer,
   wherein an average grain diameter of the crystal grains is less than 550 nm, and the first electrode contains potassium or sodium.

2. The piezoelectric element according to claim 1, wherein the first electrode contains a platinum group element as a primary component.

3. A liquid ejection head comprising:
   the piezoelectric element according to claim 2.

4. The piezoelectric element according to claim 1, wherein the first electrode contains platinum as a primary component.

5. A liquid ejection head comprising:
   the piezoelectric element according to claim 4.

6. The piezoelectric element according to claim 1, wherein the second electrode contains a platinum group element as a primary component and potassium or sodium.

7. A liquid ejection head comprising:
   the piezoelectric element according to claim 6.

8. The piezoelectric element according to claim 1, wherein the average grain diameter of the crystal grains is 150 nm or less.

9. A liquid ejection head comprising:
   the piezoelectric element according to claim 8.

10. A liquid ejection head comprising:
    the piezoelectric element according to claim 1.

11. A piezoelectric element comprising:
    a first electrode containing crystal grains;
    a piezoelectric layer which contains potassium, sodium, and niobium and which is provided above the first electrode; and
    a second electrode provided above the piezoelectric layer,
    wherein an average grain diameter of the crystal grains is less than 550 nm, and the second electrode contains a platinum group element as a primary component and potassium or sodium.

12. The piezoelectric element according to claim 11, wherein the first electrode contains a platinum group element as a primary component.

13. A liquid ejection head comprising:
the piezoelectric element according to claim 12.

14. The piezoelectric element according to claim 11, wherein the first electrode contains platinum as a primary component.

15. A liquid ejection head comprising:
the piezoelectric element according to claim 14.

16. The piezoelectric element according to claim 11, wherein the first electrode contains potassium or sodium.

17. A liquid ejection head comprising:
the piezoelectric element according to claim 16.

18. The piezoelectric element according to claim 11, wherein the average grain diameter of the crystal grains is 150 nm or less.

19. A liquid ejection head comprising:
the piezoelectric element according to claim 18.

20. A liquid ejection head comprising:
the piezoelectric element according to claim 11.

* * * * *